(12) United States Patent  (10) Patent No.: US 7,759,022 B2
Yan  (45) Date of Patent: Jul. 20, 2010

(54) PHASE SHIFT MASK STRUCTURE AND FABRICATION PROCESS

(75) Inventor: Pei-yang Yan, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 668 days.

(21) Appl. No.: 11/525,618

(22) Filed: Sep. 21, 2006

(65) Prior Publication Data

US 2008/0076035 A1  Mar. 27, 2008

(51) Int. Cl.
*G03F 1/00* (2006.01)
(52) U.S. Cl. .......................................... 430/5; 430/311
(58) Field of Classification Search ............. 430/5, 430/311–313, 322, 323, 394; 216/12, 24, 216/41; 428/428, 420; 378/34, 35
See application file for complete search history.

(56) References Cited

U.S. PATENT DOCUMENTS

| | | | |
|---|---|---|---|
| 6,830,851 B2 * | 12/2004 | Yan | 430/5 |
| 2004/0062999 A1 * | 4/2004 | Stearns et al. | 430/5 |
| 2006/0008749 A1 * | 1/2006 | Sobel et al. | 430/394 |

* cited by examiner

*Primary Examiner*—Mark F Huff
*Assistant Examiner*—Stewart A Fraser
(74) *Attorney, Agent, or Firm*—David L. Guglielmi

(57) ABSTRACT

A photomask and method for fabricating a photomask are generally described. In one example, a photomask includes a substrate, a multilayer (ML) stack having a peripheral region that is rendered substantially opaque for a desired wavelength of radiation by localized heating, and a first and second film applied to the ML stack, the thickness of the first and second films selected to provide desired phase shift and attenuation.

30 Claims, 6 Drawing Sheets

Step 1

Step 2

Step 3

Step 4

Step 5

Step 6

Step 7

PHASE SHIFT MASK STRUCTURE AND FABRICATION PROCESS

TECHNICAL FIELD

Embodiments of the present invention are generally directed to the field of semiconductor fabrication and, more particularly, to lithography photomasks.

BACKGROUND

Optical lithography is a technology used to print patterns that define integrated circuits (IC) onto semiconductor wafers. Typically, a pattern on a photomask is imaged by a highly accurate camera called a stepper or scanner and transferred onto a semiconductor wafer coated with photoresist. Continued improvements in optical lithography have enabled the printing of ever finer features. This has allowed the IC industry to produce more powerful and cost-effective semiconductor devices.

A conventional binary mask that controls the amplitude of light incident upon a wafer is often inadequate when the IC feature size is small. Under sub-wavelength conditions, additive amplitude effects, optical distortions as well as diffusion and loading effects of photosensitive resist and etch processes may cause printing aberrations. Phase shifting improves the resolution that optical lithography can attain, producing smaller, higher-performance IC features by modulating the projected light at the mask level. Phase-shifting masks may be used, for example, for optical lithography for the generation of IC feature sizes below one micron such as 0.25 micron.

Successors to optical lithography are being developed to further improve the resolution. Extreme-ultraviolet (EUV) lithography is one of the leading successors to optical lithography. It may be viewed as a natural extension, since it uses short wavelength optical radiation to carry out projection imaging (i.e.—a wavelength on the order of about 13 nm). However, EUV lithography technology may be different from preceding technologies in that properties of materials with respect to EUV radiation are different from their properties with respect to other types of radiation such as visible and deep ultraviolet (DUV) ranges. For example, the EUV radiation is strongly absorbed in most materials, including gas. Thus, EUV imaging systems often utilize entirely reflective optical elements rather than refractive elements, such as lenses.

The attenuation and phase for current phase-shift masks are typically obtained by a single layer attenuating film. As a result, the attenuation is a fixed value. Also, the current phase shift masks often undergo multiple patterning steps to darken the peripheral region of the mask. The peripheral region is darkened to prevent light leakage and minimize any mask flare effects. Improvements to the phase shift mask structure that allow for tunable attenuation and peripheral darkening without additional patterning/etching steps may provide many benefits including cost savings from fewer process steps, more latitude in attenuation range, and ability to use the same deposition and etch chemistries for different attenuation.

BRIEF DESCRIPTION OF THE DRAWINGS

Embodiments of the present invention are illustrated by way of example, and not by way of limitation, in the figures of the accompanying drawings in which like reference numerals refer to similar elements and in which.

DETAILED DESCRIPTION

Embodiments of a phase-shift mask structure and fabrication process are described herein. In the following description, numerous specific details are set forth to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the specification.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments.

Figure 1:
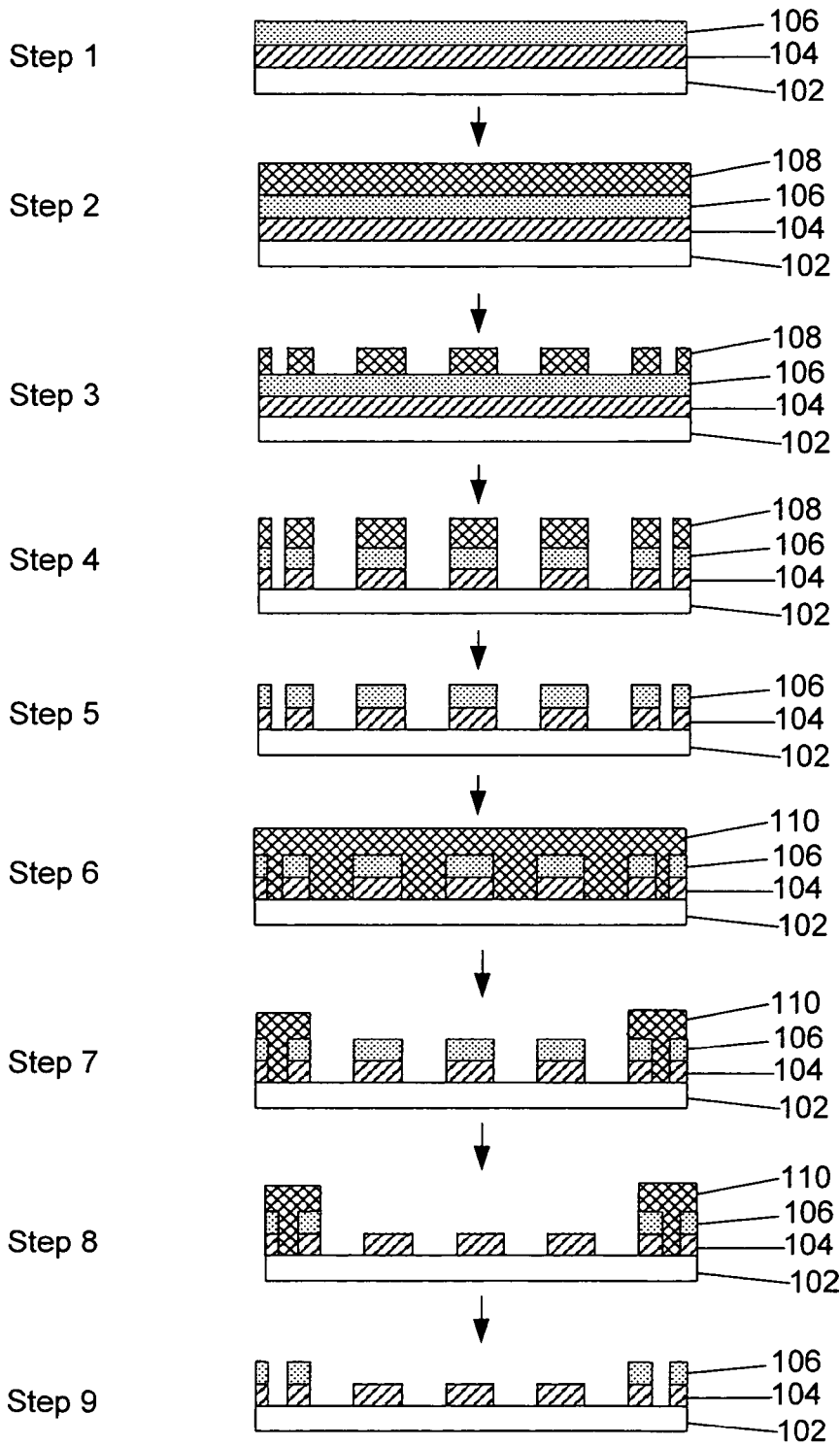
FIG. 1 is a diagram illustrating an example process for fabricating a photomask.

FIG. 1 is a diagram illustrating an example process 100 for fabricating a photomask. In one embodiment, arrows suggest a flow path for a mask-making process 100. In step 1, a substrate 102 is coated with a single absorber film 104 and a darkening film 106, each coupled as shown according to one embodiment. Materials suitable for a substrate 102, single absorber film 104, and a darkening film 106 may be selected to at least provide desired photomask properties such as phase shift and attenuation for any incident EUV radiation. In one example, substrate 102 comprises quartz, single absorber film 104 comprises MoSi, and darkening film 106 comprises Cr or CrN.

In step 2, a layer of resist 108 is deposited upon the darkening layer 106 as shown, according to one embodiment. In step 3, resist layer 108 is selectively patterned to create a desired pattern in the resist 108. In one embodiment, a desired pattern comprises at least one or more integrated circuit designs. In another embodiment, resist layer 108 is selectively patterned by e-beam.

In step 4, an etching process transfers the patterned image in the resist 108 to the darkening film 106 and the single absorber film 104 as shown, according to an embodiment. The etching process may comprise two different etch processes, for example, an etch process to pattern the darkening layer 106 and a separate etch process to pattern the single absorber film. In step 5, any remaining resist 108 is stripped or removed.

In step 6, resist 110 is applied to the darkening layer 106, single absorber film 104, and substrate 102, as shown, according to one embodiment. In step 7, resist 110 is selectively patterned. In one embodiment, resist 110 is patterned by laser or e-beam. According to another embodiment, resist 110 is removed from the mask printing area. The mask printing area may include one or more integrated circuit patterns for printing an image on a semiconductor substrate. In another embodiment, resist 110 covers the mask frame region after step 7 patterning. A peripheral region may include a mask frame region that includes a region of the mask outside of the mask printing area. In one embodiment, the mask frame region remains coated with resist after step 7 patterning to prevent etching of the darkening layer in subsequent steps. The remaining darkening layer darkens the frame region of the resultant mask.

In step 8, exposed darkening layer 106 is etched away from the mask printing area and resist-coated darkening layer 106 remains in the frame region. In step 9, any remaining resist is stripped or removed.

An example summary of process 100 for producing a photomask with a single attenuating layer and darkened peripheral region follows. In one embodiment of process 100, the peripheral region of a photomask is darkened by first applying a Cr film 106 onto a single attenuating film 104 (step 1). The Cr 106 and attenuating film 104 are patterned and etched a first time to create a circuit design pattern in the mask (steps 2-5). Then, another patterning/etching process removes the Cr 106 in the center region overlying the circuit pattern, while leaving Cr 106 in the peripheral region (steps 6-9). Such process 100 creates a photomask with a single attenuating film resulting in a single attenuation determined by the composition of material used for the attenuating film. Such process 100 also requires deposition of a darkening layer 106 and additional patterning steps (steps 6-9) to darken the peripheral region. Darkening, in this context, means to render substantially opaque for a desired wavelength of radiation.

Figure 2:
FIG. 2 is a diagram illustrating another process for fabricating a photomask, according to but one embodiment.
Figure 2:
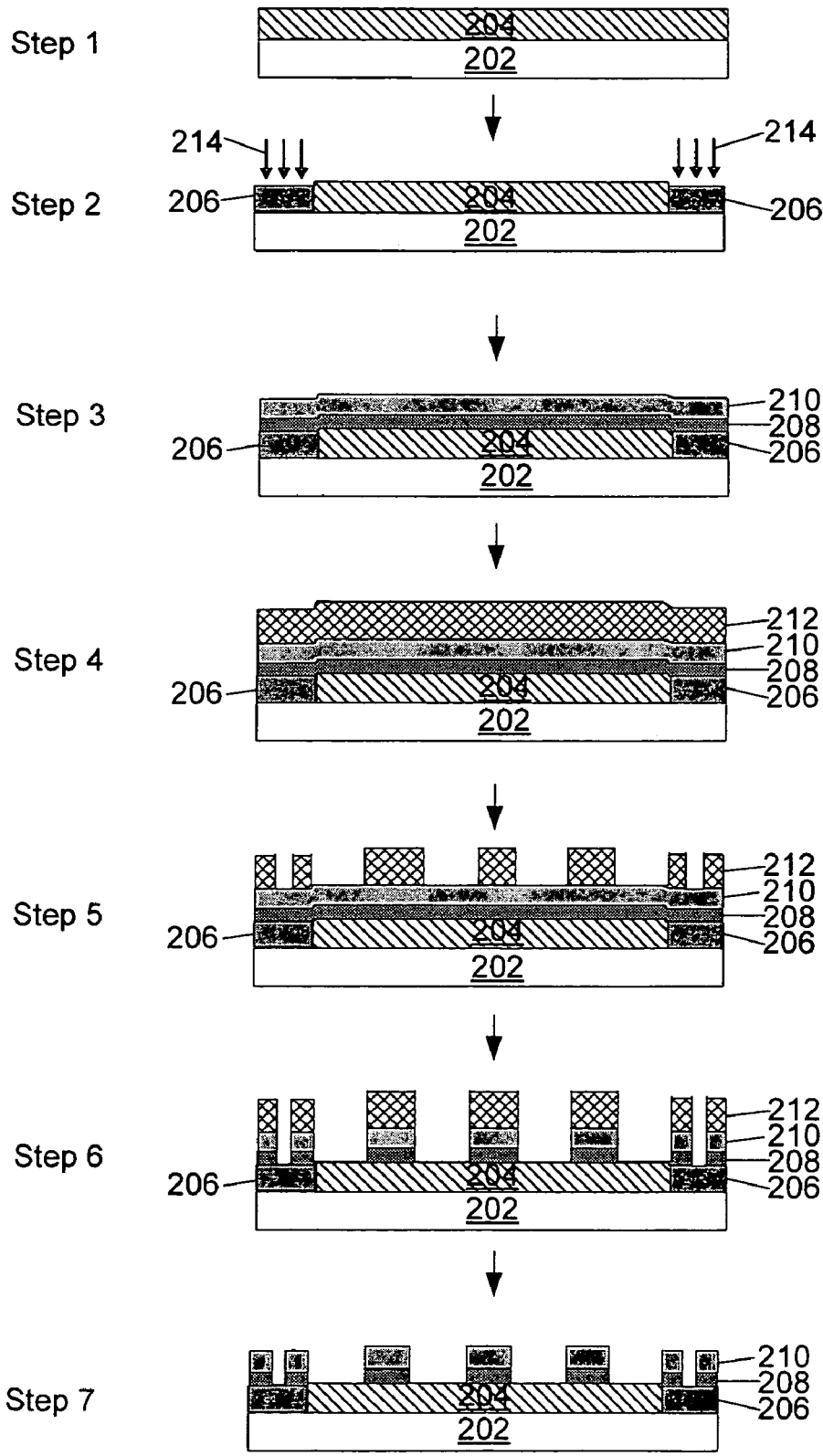
Figure 2:
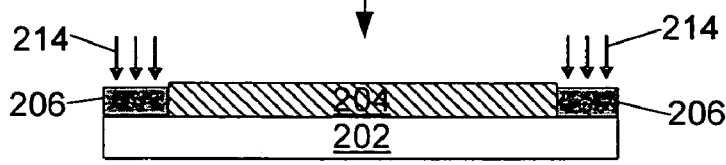
Figure 2:
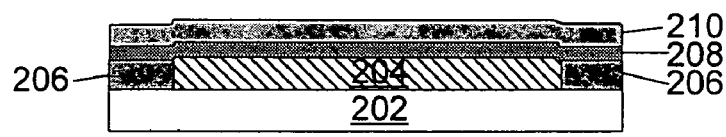
Figure 2:
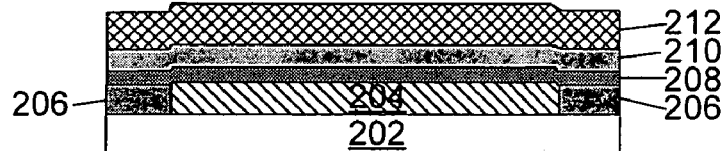
Figure 2:
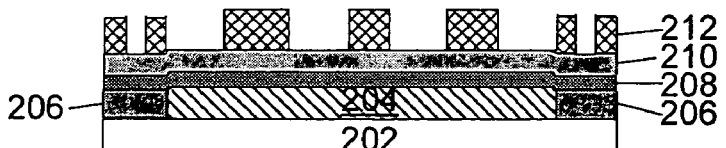
Figure 2:
Figure 2:
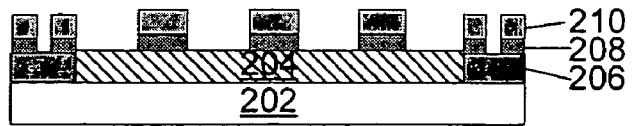

FIG. 2 is a diagram illustrating another process 200 for fabricating a photomask, according to but one embodiment. Arrows suggest a flow path for a mask-making process 200. In step 1, a substrate 202 is provided and coated with a multilayer (ML) stack 204 according to one embodiment. Depositing a ML stack 204 on the substrate 202 can be accomplished by a wide variety of well known thin films deposition methods. In an example embodiment, substrate 202 comprises a low thermal expansion material (LTEM). In an embodiment, the substrate 202 is made of a material that has a low coefficient of thermal expansion (CTE). A low CTE provides stability against temperature changes. A typical CTE is +/−30 parts per billion (ppb)/° C. over a temperature range of 5° C. to 35° C. Other ranges (ppb) are possible for less typical CTE's. Other properties of the substrate 202 may include stability against crystallization, thermal cycling, and mechanical cycling.

In another embodiment, ML stack 204 comprises alternating layers of Mo and Si. For example, according to one embodiment ML stack 204 comprises 80-100 alternating layers of Mo and Si (or 40-50 pairs of Mo and Si). Materials for ML stack 204 and thickness of the alternating layers are selected particularly for at least desired optical properties such as achieving maximum reflectivity at desired EUV exposure wavelength. Achieving high reflectance for a given wavelength may be governed by the Bragg diffraction condition. In an embodiment, particular materials selected for ML stack 204 effectively darken against EUV radiation after sufficient localized heating. In other words, particular ML stack 204 materials can be rendered substantially opaque for a desired wavelength of radiation by heating the particular material(s).

In step 2 of process 200, local heating 214 is applied to the ML stack 204 to darken a desired region 206. Darkening, in this context, means to render substantially opaque for a given wavelength of radiation. For example, in one embodiment, the peripheral region 206 of the ML stack 204 includes a frame region that is darkened against EUV-type radiation by local heating. EUV-type radiation may have a wavelength of about 13 nm. Creating a dark frame region around the mask periphery prevents unwanted light leakage and reflection that causes additional flare. In an embodiment, the mask frame region 206 is outside of the mask device area, the mask device area including the patterned microcircuitry on the mask that is intended to become imaged on a microelectronic device.

In an embodiment, mask darkening 206 is accomplished by local heating 214 of the peripheral region 206 of ML stack 204 defining a mask frame region 206. ML stack 204 may comprise one or more particular material(s) suited for being darkened or rendered substantially opaque for a desired wavelength of radiation by heating the particular material(s). In one embodiment, mask darkening 206 is accomplished by local heating 214 of the ML stack 204, which partially or completely forms Molybdenum Silicide (MoSi) 206 from alternating layers of Mo and Si 204. In one embodiment, ML stack 204 includes 80-100 alternating layers of Mo and Si 204. Creating heat-induced MoSi 206 prevents EUV light reflection in the MoSi region 206. Darkened region 206 may appear depressed compared to ML stack 204 because Mo/Si ML material that has been partially or completely converted to MoSi 206 may shrink and occupy a smaller volume than Mo/Si ML stack 204.

Figure 3:
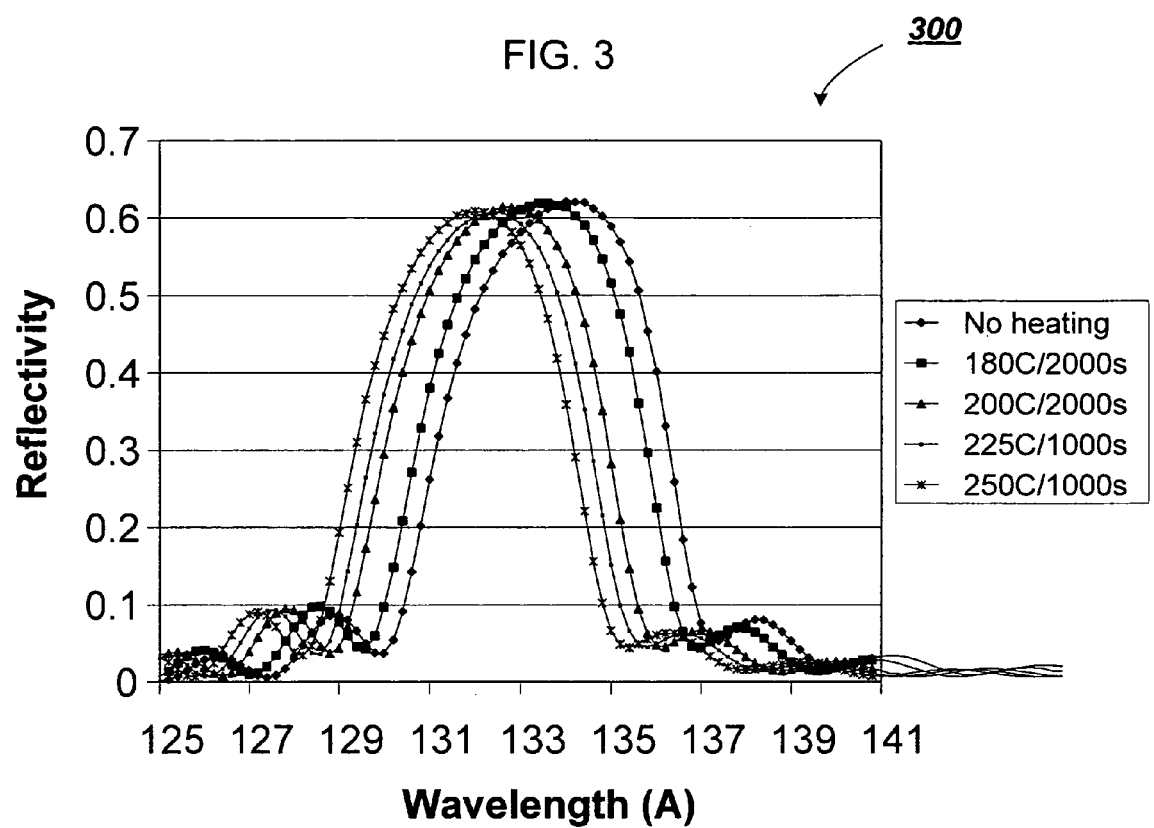
FIG. 3 is a graph illustrating a heat-induced spectrum shift, according to but one embodiment.

In an embodiment, it is not necessary to completely silicide 206 the Mo and Si ML stack 204 to achieve desired darkening. Partial silicide 206 can induce an EUV reflectivity peak shift towards shorter wavelength sufficient to move the mask reflected spectrum out of the band-pass spectrum of EUV optics, resulting in effective darkening 206 with only partial formation of MoSi (see FIG. 3). FIG. 3 is a graph 300 depicting the heat-induced band pass spectrum shift for heated Mo and Si for various temperatures and times. As the temperature increases, the spectrum shifts toward shorter wavelengths. The temperature needed to induce sufficient MoSi for darkening 206 may be as low as about 200° C. Local heating 214 may be accomplished by e-beam, laser, or any other suitable localized heating method. In an embodiment, the ML stack 204 comprises alternating layers of Mo and Si and the heating 214 forms enough MoSi to substantially darken the peripheral region 206 of the ML stack 204.

Frame darkening 206 by local heating 214 as depicted in process 200 provides a benefit of eliminating the additional film deposition and patterning steps needed for depositing and patterning the darkening layer (i.e.—Cr) depicted in process 100, greatly simplifying the mask fabrication process.

In step 3 of process 200, a first attenuating film 208 of a first selected thickness is deposited onto at least ML stack 204 and a second attenuating film 210 of a second selected thickness is deposited onto the first film 208, each coupled as shown, according to an embodiment. In an embodiment, the first and second thicknesses of the first 208 and second 210 films are selected to provide desired phase shift and attenuation. For example, first 208 and second 210 films may be selected to provide a desired phase shift between the absorber region 208, 210 and the ML reflective region 204. According to one example, the first and second thicknesses of the first 208 and second 210 films are selected to provide a phase shift of about 180 degrees and attenuation between about 4% and 20%.

In an embodiment, first 208 and second 210 films are absorber materials that provide adjustable attenuation by adjusting the thickness of the films 208, 210. For example, by varying the ratio of the first 208 and second 210 film thicknesses, EUV reflection can be modulated to change from about 4% to about 20%. Such tunable attenuation with a two-material combination provides a benefit of allowing attenuation changes without requiring an entirely new process such as a new etch chemistry or deposition process. Adjusting attenuation in a dual absorbing film 208, 210 may require small adjustments to the existing etch and deposition times to accommodate film thickness changes. In contrast, a different attenuation is achieved in a single absorber film (i.e.—see film 104 of FIG. 1) by changing the material for the single absorber film, which may require the costly development of a new etch chemistry or deposition process, for example.

In an embodiment, an anti-reflective coating (ARC) layer (not shown) is deposited onto the second film 210. An ARC layer typically provides an anti-reflection effect under a mask inspection wavelength. Typically, the ARC layer is a fixed thickness layer for a given material. In one embodiment, an ARC layer comprising TaON is applied to the second film 210. Tunable attenuation can be achieved with or without an ARC layer.

Materials for first 208 and second 210 films are selected to provide a simple and consistent process with existing mask fabrication processes and larger tunable reflection range, according to one embodiment. Table 1 provides a list of example material combinations for a first 208 and second 210 film with corresponding reflection and thickness ranges.

TABLE 1

Example Materials for EUV Absorber Combinations

| Two Material Combination | Attenuated Reflection Range (%) | Total Absorber Thickness Range (Å) |
|---|---|---|
| TaN/MoSi | 4-20 | 540-420 |
| TaN/MoSiON | 4-20 | 500-400 |
| TaN/C | 4-20 | 840-680 |
| TiN/SiO$_2$ | 6-11 | 1250-397 |
| Mo/SiO$_2$ | 7-18 | 1400-980 |
| TiN/Mo | 12-16 | 560-540 |
| Cr/C | 10-15 | 1060-1250 |
| TaN/TiN | 6-11 | 575-560 |

Multiple embodiments for suitable material combinations include but are not necessarily limited to the following combinations: a first film 208 comprising MoSi and a second film 210 comprising TaN, a first film 208 comprising MoSiON and a second film 210 comprising TaN, a first film 208 comprising C and a second film 210 comprising TaN, a first film 208 comprising SIO$_2$ and a second film 210 comprising TiN, a first film 208 comprising SIO$_2$ and a second film 210 comprising Mo, a first film 208 comprising Mo and a second film comprising TiN 210, a first film comprising C 208 and a second film comprising Cr 210, and a first film 208 comprising TiN and a second film 210 comprising TaN. Such combinations may have an optional ARC layer on the second film 210 and may yield 180-degree phase shift and desired reflectivity depending upon the thickness ratio of the two films 208, 210.

Other embodiments are disclosed wherein an element in the disclosed materials above is replaced by another element from the same family in the periodic table of elements. For example, TaN may be modified to form another suitable compound such as TaX where X represents another element from the same family in the periodic table of elements. An element from the same family may have the same number of valence electrons. Other analogous modifications to create suitable materials are envisioned.

In other embodiments, for example, other material combinations are disclosed where chemical modifications to materials listed above provide suitable materials for absorber films 208, 210. According to one example, Mo$_x$Si$_y$ within a certain range of x to y ratio of each element in the compound, such as MoSi$_2$, may be suitable as an absorber film material 208, 210. In another example, Ta$_x$N$_y$ within a certain range of x to y ratio of each element in the compound, such as Ta$_2$N, may be suitable as an absorber film material 208, 210. Analogous modifications to create suitable materials are envisioned and disclosed.

Figure 4:
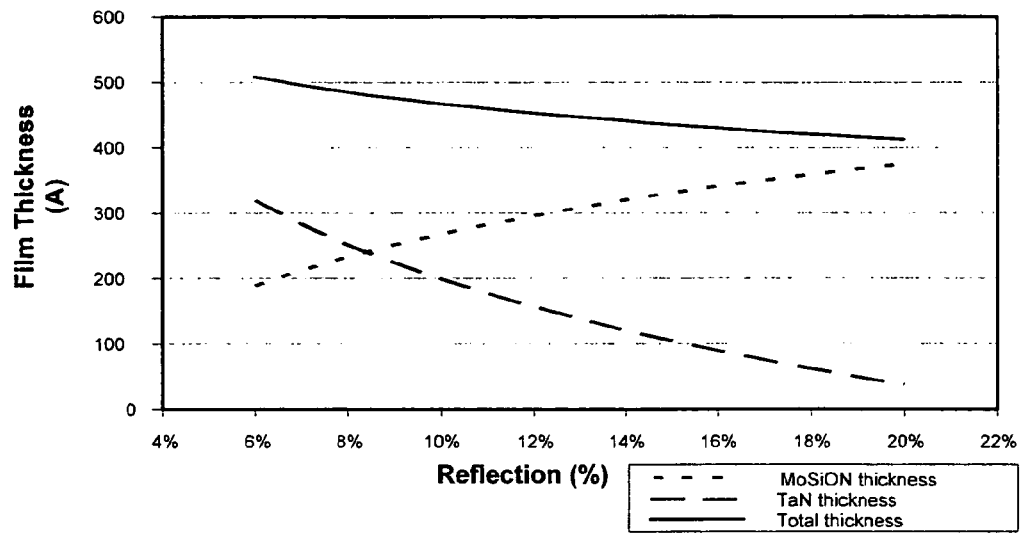
FIG. 4 is a graph of film thickness requirements for different EUV reflections, according to but one embodiment.

FIG. 4 is a graph 400 of film thickness requirements for different EUV reflections using a TaN 210 and MoSiON 208 combination. In one embodiment, a desired attenuation is less than 10% to avoid side lobe printing.

Tunable attenuation can also be achieved with the addition of an optional ARC layer on the second film 210. Table 2 provides a list of example material combinations for a first 208 and second film 210 having an additional ARC layer comprising 12 nm of TaON with corresponding reflection and thickness ranges.

TABLE 2

Example Materials for EUV Absorber Combinations w/ARC Layer

| Two Material Combination + 12 nm TaON ARC Layer | Attenuated Reflection Range (%) | Total Absorber Thickness Range (Å) |
|---|---|---|
| MoSi/TaN | 4-20 | 526-586 |
| MoSiON/TaN | 4-15 | 500-400 |
| C/TaN | 4-18 | 840-680 |

Figure 5:
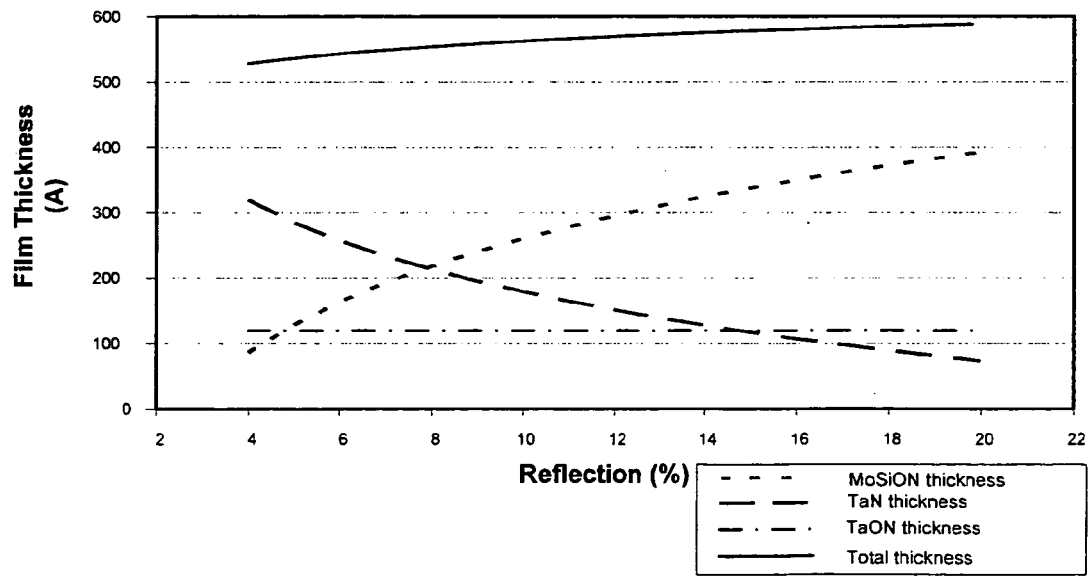
FIG. 5 is another graph of film thickness requirements for different EUV reflections, according to but one embodiment.

FIG. 5 is a graph 500 of film thickness requirements for different EUV reflections using a MoSi 208, TaN 210 and TaON (ARC layer) combination, according to an embodiment. In one embodiment, a desired attenuation is less than 10% to avoid side lobe printing.

Steps 4-7 of process 200 illustrate a patterning process according to one embodiment. In step 4, resist 212 is deposited on the second film 210. In step 5, a pattern is created in the resist 212. In an embodiment, a pattern in the resist 212 includes at least one or more integrated circuit design(s). According to various embodiments, patterning can be accomplished using an e-beam, laser or any other suitable patterning technology.

In step 6, the pattern in the resist 212 is substantially transferred to at least the first 208 and second 210 films to create a desired pattern in the absorber films 208, 210, as shown. In an embodiment, an etching process strips away material from the first 208 and second 210 films, creating one or more integrated circuit design(s) into at least the first 208 and second 210 films. Etching may strip away portions of the first and second films underlying the exposed resist leaving a circuit pattern in the remaining first 208 and second 210 films. In one embodiment, a first film 208 comprising MoSi or MoSiON combined with a second film 210 comprising TaN (with or without TaON ARC layer) provides a benefit of using a typical etch chemistry for patterning such as Cl$_2$ or Fl$_2$ etching. In another embodiment, a single absorber etch step is used to pattern both the first and second absorber films 208, 210.

In step 7, remaining resist 212 is stripped or removed. Additionally, according to one embodiment, the resultant product of process 200 is inspected for defects in the patterned design and if any repairable defects are found, they are repaired.

Figure 6:
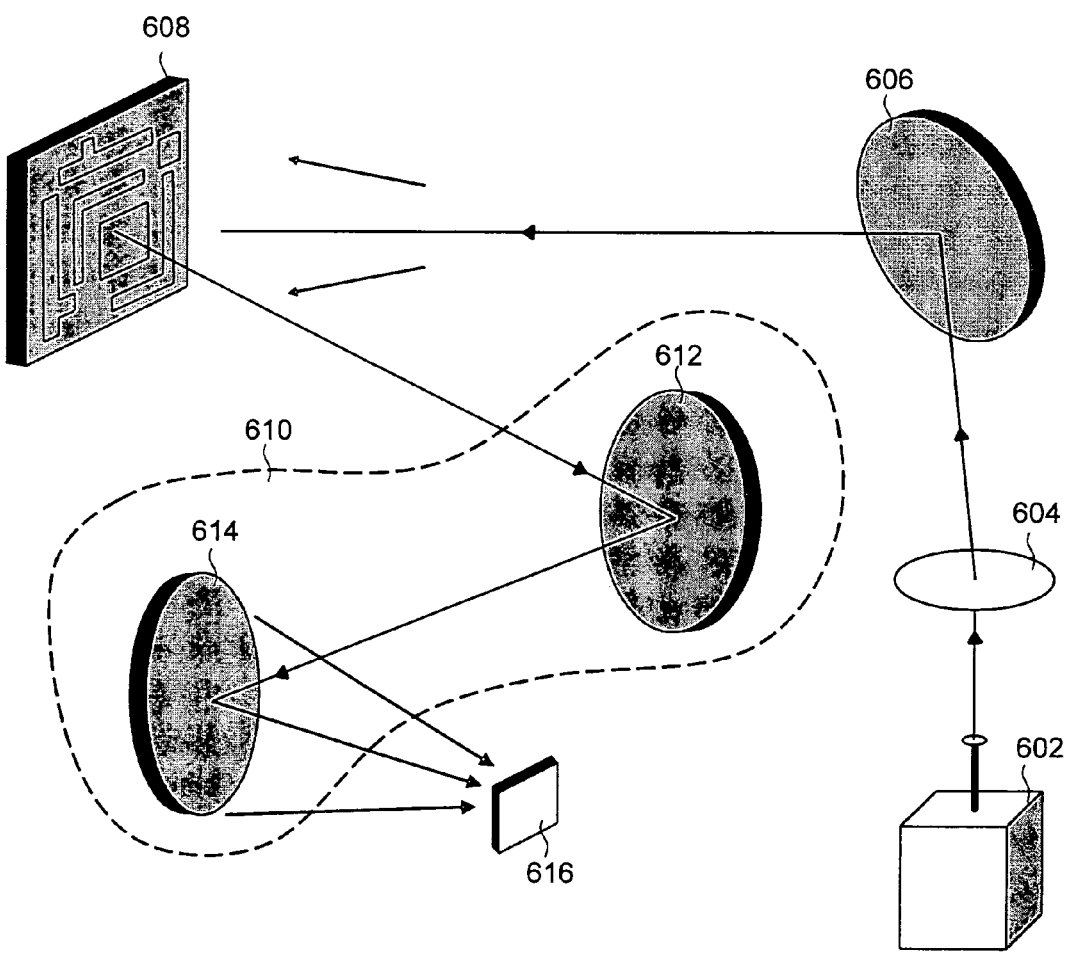
FIG. 6 is a diagram illustrating an example system in which embodiments of the present invention may be used.

FIG. 6 is a diagram illustrating an example system 600 in which embodiments of the present invention may be used. System 600 is an EUV lithography system comprising laser 602, plasma 604, optical condenser 606, photomask 608, reduction optics 610, and semiconductor substrate 616, each coupled as shown according to one embodiment. In an embodiment, system 600 is an EUV stepper or scanner. Arrows suggest a radiation pathway through the system 600.

In an embodiment, the laser 602 generates a laser beam to bombard a target material, which produces plasma 604 with significant broadband extreme ultra-violet (EUV) radiation. The optical condenser 606 collects the EUV radiation through mirrors coated with EUV interference films. The optical condenser 606 illuminates the reflective mask 608 with EUV radiation of about 13 nm wavelength. The reflective mask 608 is a photomask according to embodiments described herein. In an embodiment, photomask 608 is an EUV embedded phase shift mask fabricated by process 200. Mask 608 has an absorber pattern across its surface, which may comprise one or more integrated circuit designs. The pattern may be imaged at 4:1 or 5:1 demagnification by the reduction optics 610. Other demagnification ratios are possible. The reduction optics 610 may include mirrors such as mirrors 612 and 614. These mirrors, for example, may be aspherical with tight surface figures and roughness (e.g., less than 3 Angstroms).

In an embodiment, the semiconductor substrate 616 is coated with resist that is sensitive to EUV radiation. The semiconductor substrate 616 may be a silicon-based wafer. The resist is imaged by the pattern on the reflective mask 608. Typically, a step-and-scan exposure may be performed, i.e., the photomask 608 and the substrate 616 are synchronously scanned. Using this technique, a resolution less than 50 nm may be possible. Note that the diagrams shown in the figures are for illustrative purposes only. The dimensions are not scaled.

Figure 7:
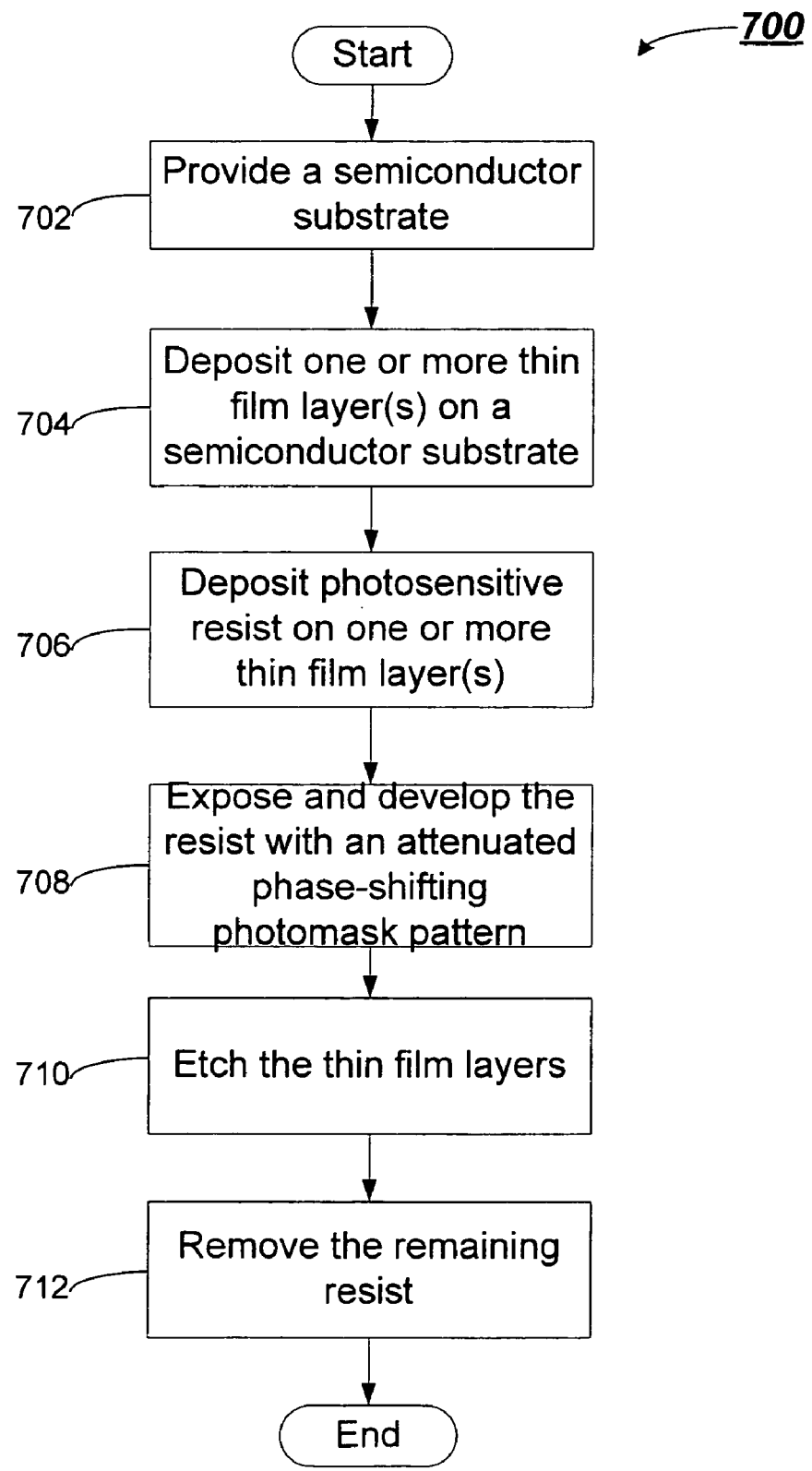
FIG. 7 is a flow diagram illustrating an example method in which embodiments of the present invention may be used.

FIG. 7 is a flow diagram illustrating an example method 700 in which embodiments of the present invention may be used. Method 700 is a method for fabricating an integrated circuit on a semiconductor substrate that includes providing a semiconductor substrate 702, depositing one or more thin film layer(s) on a semiconductor substrate 704, depositing photosensitive resist on one or more thin film layer(s) 706, exposing the resist with an attenuated phase-shifting photomask 708, developing the resist 708, etching the thin film layers 710, and removing the remaining resist 712, according to one embodiment. In one embodiment, a photomask used in step 708 accords with embodiments of a photomask described in process 200.

An apparatus that executes the above-specified process is also disclosed. The apparatus comprises a machine-readable storage medium having executable instructions that enable the machine to perform the steps in the specified process.

Various operations may be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A photomask comprising:
a substrate;
a multilayer (ML) stack coupled to the substrate, the ML stack comprising one or more particular material(s) and having a peripheral region, the peripheral region being rendered substantially opaque for a desired wavelength of radiation by heating the particular material(s);
a first film of a first selected thickness coupled to the ML stack; and
a second film of a second selected thickness coupled to the first film, the first thickness and the second thickness selected to provide desired phase shift and attenuation.

2. A photomask according to claim 1, wherein at least a portion of the first and second films are patterned according to a desired circuit design.

3. A photomask according to claim 1, wherein the first film comprises a material selected from the group consisting of MoSi, MoSiON, and C.

4. A photomask according to claim 3, wherein the second film comprises TaN.

5. A photomask according to claim 1, further comprising an anti-reflective coating (ARC) layer coupled to the second film.

6. A photomask according to claim 5, wherein the ARC layer comprises TaON.

7. A photomask according to claim 1, wherein the first film comprises $SiO_2$ and the second film comprises TiN.

8. A photomask according to claim 1, wherein the first film comprises $SiO_2$ and the second film comprises Mo.

9. A photomask according to claim 1, wherein the first film comprises Mo and the second film comprises TiN.

10. A photomask according to claim 1, wherein the first film comprises C and the second film comprises Cr.

11. A photomask according to claim 1, wherein the first film comprises TiN and the second film comprises TaN.

12. A photomask according to claim 1, wherein the one or more particular material(s) of the ML stack comprises 80-100 alternating layers of Mo and Si and the heating forms enough MoSi to substantially darken the peripheral region of the ML stack.

13. A photomask according to claim 1, wherein the peripheral heating of the ML stack is accomplished by e-beam.

14. A photomask according to claim 1, wherein the peripheral heating of the ML stack is accomplished by laser.

15. A photomask according to claim 1, wherein the peripheral region of the ML stack is rendered substantially opaque for radiation with a wavelength of about 13 nm.

16. A photomask according to claim 1, wherein the desired phase shift is about 180 degrees and the desired attenuation is between about 4% and 20%.

17. A method for fabricating a photomask comprising:
providing a substrate;
depositing a multilayer (ML) stack on the substrate, the ML stack comprising one or more particular material(s) and having a peripheral region;
heating the peripheral region of the ML stack to render the peripheral region substantially opaque for a desired wavelength of radiation;
depositing a first film of a first selected thickness on the ML stack; and
depositing a second film of a second selected thickness on the first film, the first and second thickness selected to provide desired phase shift and attenuation.

18. A method according to claim 17, further comprising:
patterning a desired circuit design into the first and second films.

19. A method according to claim 18, wherein patterning comprises:
depositing resist on the second film;
patterning a circuit design into the resist using e-beam exposure;
etching away the portions of the first and second films underlying the exposed resist to leave a circuit pattern in the remaining first and second films; and
removing any remaining resist.

20. A method according to claim 19, further comprising:
inspecting at least the patterned design in the first and second films for defects; and
repairing any defects found.

21. A method according to claim 17, further comprising:
depositing an anti-reflective coating (ARC) layer on the second film.

22. A method according to claim 21, wherein the ARC layer comprises TaON.

23. A method according to claim 17, wherein the first film comprises MoSi and the second film comprises TaN.

24. A method according to claim 17, wherein the first film comprises MoSiON and the second film comprises TaN.

25. A method according to claim 17, wherein the first film comprises C and the second film comprises TaN.

26. A method according to claim 17, wherein the particular material of the ML stack comprises 80-100 alternating layers of Mo and Si and the heating of Mo and Si in the peripheral region of the ML stack forms enough MoSi to substantially darken the peripheral region of the ML stack.

27. A method according to claim 17, wherein heating the peripheral region of the ML stack is accomplished by e-beam.

28. A method according to claim 17, wherein heating the peripheral region of the ML stack is accomplished by laser.

29. A method according to claim 17, wherein heating the peripheral region of the ML stack renders the peripheral region substantially opaque for radiation with a wavelength of about 13 nm.

30. A method according to claim 17, wherein the desired phase shift is about 180 degrees and the desired attenuation is between about 4% and 20%.

* * * * *